(12) United States Patent
Sugiyama

(10) Patent No.: US 11,143,889 B2
(45) Date of Patent: Oct. 12, 2021

(54) OPTICAL DEVICE, TEST METHOD, OPTICAL TRANSMISSION AND RECEPTION DEVICE, AND MANUFACTURING METHOD

(71) Applicant: FUJITSU OPTICAL COMPONENTS LIMITED, Kawasaki (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/848,108

(22) Filed: Apr. 14, 2020

(65) Prior Publication Data

US 2020/0371384 A1    Nov. 26, 2020

(30) Foreign Application Priority Data

May 24, 2019  (JP) .............................. JP2019-097755

(51) Int. Cl.
| | |
|---|---|
| *G02F 1/035* | (2006.01) |
| *G02F 1/025* | (2006.01) |
| *G01R 19/165* | (2006.01) |
| *G01M 11/00* | (2006.01) |
| *G01R 31/00* | (2006.01) |
| *G01R 1/067* | (2006.01) |
| *H04B 10/66* | (2013.01) |
| *H04B 10/50* | (2013.01) |
| *G02F 1/015* | (2006.01) |

(52) U.S. Cl.
CPC ............. *G02F 1/025* (2013.01); *G01M 11/30* (2013.01); *G01R 1/06711* (2013.01); *G01R 19/165* (2013.01); *G01R 31/00* (2013.01); *G02F 1/0151* (2021.01); *H04B 10/50* (2013.01); *H04B 10/66* (2013.01)

(58) Field of Classification Search
CPC ..... G02F 1/025; G02F 1/0151; G01R 19/165; G01R 31/00; G01R 1/06711; G01M 11/30; G01M 11/33; H04B 10/66; H04B 10/50
See application file for complete search history.

(56) References Cited

U.S. PATENT DOCUMENTS

| | | | |
|---|---|---|---|
| 6,437,899 B1 * | 8/2002 | Noda ..................... | G02F 1/0121 257/728 |
| 6,762,493 B2 * | 7/2004 | Kojima ................... | H01L 23/66 257/727 |
| 2013/0108207 A1 | 5/2013 | Thylen et al. | |
| 2014/0086523 A1 | 3/2014 | Block et al. | |

* cited by examiner

*Primary Examiner* — Ellen E Kim
(74) *Attorney, Agent, or Firm* — Staas & Halsey LLP

(57) ABSTRACT

An optical transmission device includes: a substrate; a waveguide that is provided in the substrate and transmits an optical signal; a signal wiring that is provided in the substrate and transmits an electric signal; and a silicon wiring that is provided in the substrate and is silicon added with an impurity. The signal wiring is placed in an area of the substrate, the area being away from an end of the substrate by a predetermined distance or more. One end of the silicon substrate is connected to the signal wiring, and the other end of the silicon wiring extends to the end of the substrate.

10 Claims, 15 Drawing Sheets

OPTICAL DEVICE, TEST METHOD, OPTICAL TRANSMISSION AND RECEPTION DEVICE, AND MANUFACTURING METHOD

CROSS-REFERENCE TO RELATED APPLICATION

This application is based upon and claims the benefit of priority of the prior Japanese Patent Application No. 2019-097755, filed on May 24, 2019, the entire contents of which are incorporated herein by reference.

FIELD

The embodiment discussed herein is related to an optical device, a test method, an optical transmission and reception device, and a manufacturing method.

BACKGROUND

Downsizing of optical devices, such as optical modulators, has been advancing. Because silicon waveguides have strong optical confinement effect and enable reduction of bend radii of waveguides, silicon waveguides enable optical modulators to be reduced in size as compared to conventional LN modulators and compound semiconductor modulators. In an optical modulator having a silicon waveguide used therein, a PN junction is provided in the silicon waveguide, voltage is applied to the PN junction via a metal wiring, an electric field is thereby generated in the PN junction, and the refractive index of the silicon waveguide is thereby changed. When the refractive index of the silicon waveguide is changed, the velocity of an optical signal propagated through the silicon waveguide is changed and the phase of the optical signal output from the silicon waveguide is changed. In the optical modulator having the silicon waveguide used therein, optical signals are able to be modulated by utilization of this property.

Furthermore, the optical modulator having the silicon waveguide used therein is able to be manufactured in a silicon process and plural optical devices are able to be formed on a single substrate. In the manufacturing process of the optical devices, various electrical properties are checked on the substrate prior to dicing. The electrical properties are checked while a probe needle of a prober is brought into contact with a wiring of each optical device. On the substrate prior to dicing, the electrical properties may be checked collectively for the plural optical devices. Conventional technique is described in U.S. Patent Application Publication No. 2013/0108207.

When downsizing of optical devices is advanced, wirings in the optical devices become thinner and wiring intervals are thus also narrowed. Furthermore, when downsizing of optical devices is advanced, securing space for formation of pads with which probe needles are brought into contact becomes difficult. Therefore, when downsizing of optical devices is advanced, bringing a probe needle into contact with an optical device on a substrate prior to dicing and checking electric properties of the optical device become difficult.

SUMMARY

According to an aspect of an embodiment, an optical device includes a substrate, a waveguide, a metal wiring, and a silicon wiring. The waveguide is provided in the substrate and transmits an optical signal. The metal wiring is provided in the substrate and transmits an electric signal. The silicon wiring is provided in the substrate and is silicon added with an impurity. The metal wiring is placed in an area of the substrate. The area is away from an end of the substrate by a predetermined distance or more. One end of the silicon wiring is connected to the metal wiring. The other end of the silicon wiring extends to the end of the substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preferred embodiments of the present invention will be explained with reference to accompanying drawings. The embodiment described below does not limit the techniques disclosed herein.

Configuration of Optical Transmission and Reception Device 10

Figure 1:
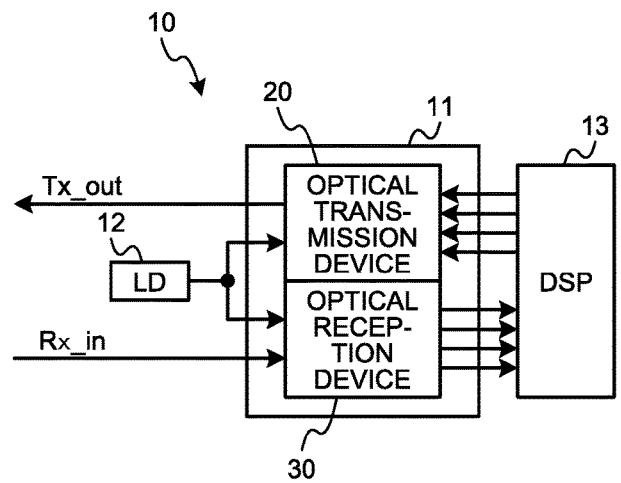
FIG. 1 is a diagram illustrating an example of an optical transmission and reception device.

FIG. 1 is a diagram illustrating an example of an optical transmission and reception device 10. The optical transmission and reception device 10 according to the embodiment includes an optical transmission and reception unit 11, a laser diode (LD) 12, and a digital signal processor (DSP) 13. The optical transmission and reception unit 11 has an optical transmission device 20 and an optical reception device 30. The optical transmission device 20 and the optical reception device 30 are examples of optical devices.

The optical transmission device 20 modulates light supplied from the LD 12, based on a transmission signal output from the DSP 13. The optical transmission device 20 then outputs an optical signal (Tx_out) that has been modulated according to the transmission signal. The optical reception device 30 receives an optical signal (Rx_in). The received optical signal is subjected to polarization division, demodulated by use of light supplied from the LD 12, converted into an electric signal, and this electric signal is output to the DSP 13.

Configuration of Optical Transmission Device 20

Figure 2:
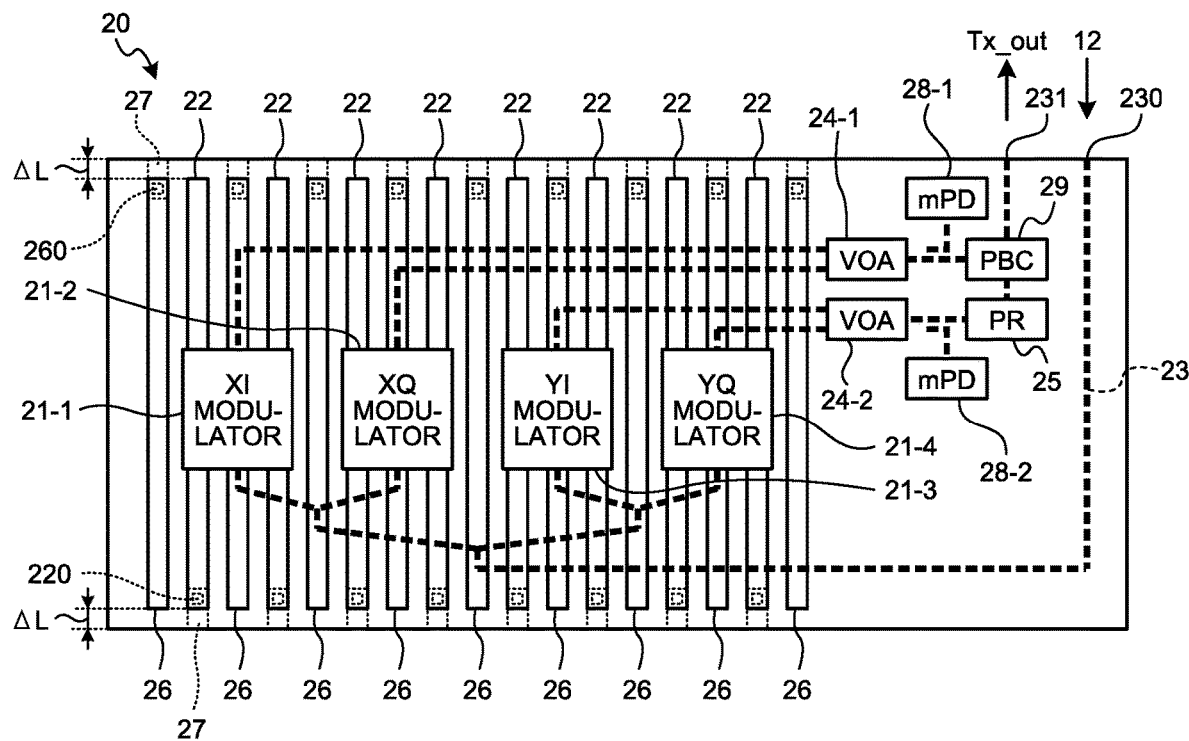
FIG. 2 is a diagram illustrating an example of an optical transmission device.

FIG. 2 is a diagram illustrating an example of the optical transmission device 20. The optical transmission device 20 includes an XI modulator 21-1, an XQ modulator 21-2, a YI modulator 21-3, and a YQ modulator 21-4. Furthermore, the optical transmission device 20 includes a VOA 24-1, a VOA 24-2, a PR 25, an mPD 28-1, an mPD 28-2, and a PBC 29. "VOA" is an abbreviation for "variable optical attenuator", "PR" is an abbreviation for "polarization rotator", "mPD" is an abbreviation for "monitor photodiode", and "PBC" is an abbreviation for "polarization beam combiner". Hereinafter, when the XI modulator 21-1, XQ modulator 21-2, YI modulator 21-3, and YQ modulator 21-4 are generally referred to without distinction among them, they will each be referred to as a modulator 21. Furthermore, hereinafter, when the VOA 24-1 and VOA 24-2 are generally referred to without distinction therebetween, they will each be referred to as a VOA 24, and when the mPD 28-1 and mPD 28-2 are generally referred to without distinction therebetween, they will each be referred to as an mPD 28.

The optical transmission device 20 has, formed thereon, a waveguide 23 through which an optical signal is propagated. Light from the LD 12 is input from an input terminal 230 of the waveguide 23 and is input to the modulators 21 via the waveguide 23. Each of the modulators 21 is provided with a PN junction and the PN junction also functions as the waveguide 23. An electric field is generated at the PN junction of each of the modulators 21 according to a voltage applied between a signal wiring 22 and a ground wiring 26 and the refractive index of the waveguide 23 at the PN junction is changed. The phase of light propagated through the waveguide 23 is thereby changed. The light is able to be modulated according to a transmission signal by change in the voltage applied to the signal wiring 22 according to the transmission signal. In the modulators 21, the transmission signals are supplied to the signal wirings 22 closer to the input terminal for the optical signal.

Intensity of the optical signals modulated by the modulators 21 is adjusted by the VOAs 24. The optical signals output from the VOAs 24 are received by the mPDs 28. The VOAs 24 adjust the intensity of the optical signals according to received optical current in the mPDs 28.

The PR 25 rotates the plane of polarization of the optical signal that has been adjusted in intensity by the VOA 24-2. The optical signal that has been adjusted in intensity by the VOA 24-1 is combined by the PBC 29 with the optical signal having the rotated plane of polarization, and the combined optical signals are output as an optical signal (Tx_out) from an output terminal 231 of the waveguide 23.

Signal wirings 22 for supplying transmission signals that are electric signals are respectively connected to the modulators 21. Ground wirings 26 connected to a ground are arranged on both sides of each of the signal wirings 22. According to this embodiment, the signal wirings 22 and the ground wirings 26 are arranged in an area of the optical transmission device 20, the area being away from an end of the optical transmission device 20 by a predetermined distance ΔL or more. Furthermore, according to this embodiment, the signal wirings 22 and the ground wirings 26 are formed of a material including a metal. The signal wirings 22 and the ground wirings 26 are examples of metal wirings.

Each of the signal wirings 22 is connected to one end of a silicon wiring 27 via a via 220. The other end of the silicon wiring 27 having the one end connected to the signal wiring 22 via the via 220 extends to an end of the optical transmission device 20. The silicon wiring 27 connected to the signal wiring 22 is an example of a first silicon wiring. Furthermore, each of the ground wirings 26 is connected to one end of a silicon wiring 27 via a via 260. The other end of the silicon wiring 27 having the one end connected to the ground wiring 26 via the via 260 extends to an end of the optical transmission device 20. The silicon wiring 27 connected to the ground wiring 26 is an example of a second silicon wiring.

According to this embodiment, the silicon wirings 27 are silicon added with an n-type impurity in a high concentration. The silicon wirings 27 may be silicon added with a p-type impurity in a high concentration.

Furthermore, according to this embodiment, the signal wirings 22 and the ground wirings 26 are formed on a surface of the optical transmission device 20 and the silicon wirings 27 are embedded inside the optical transmission device 20. In another example, the signal wirings 22 and/or the ground wirings 26 may be embedded inside the optical transmission device 20 and the silicon wirings 27 may be formed on the surface of the optical transmission device 20.

Configuration of Modulators 21

Figure 3:
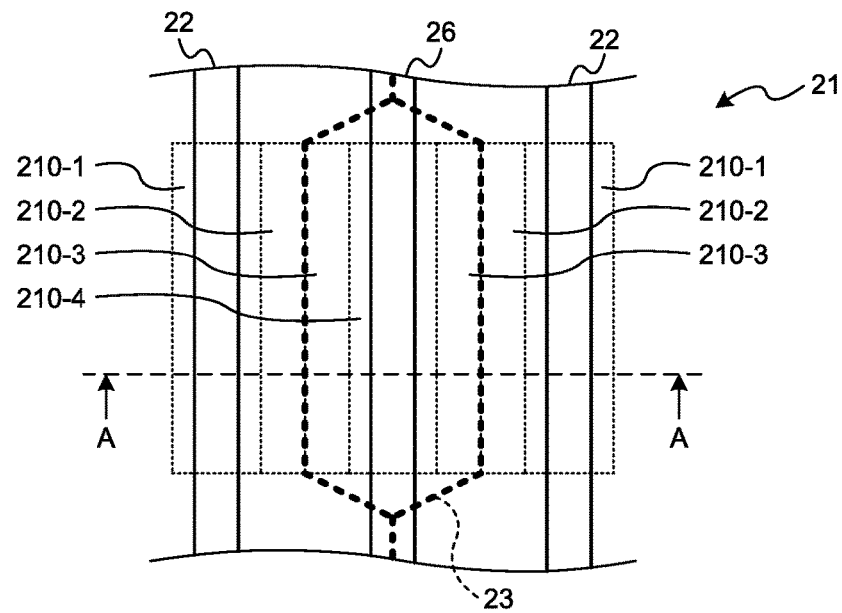
FIG. 3 is a diagram illustrating an example of a configuration of a modulator.
Figure 4:
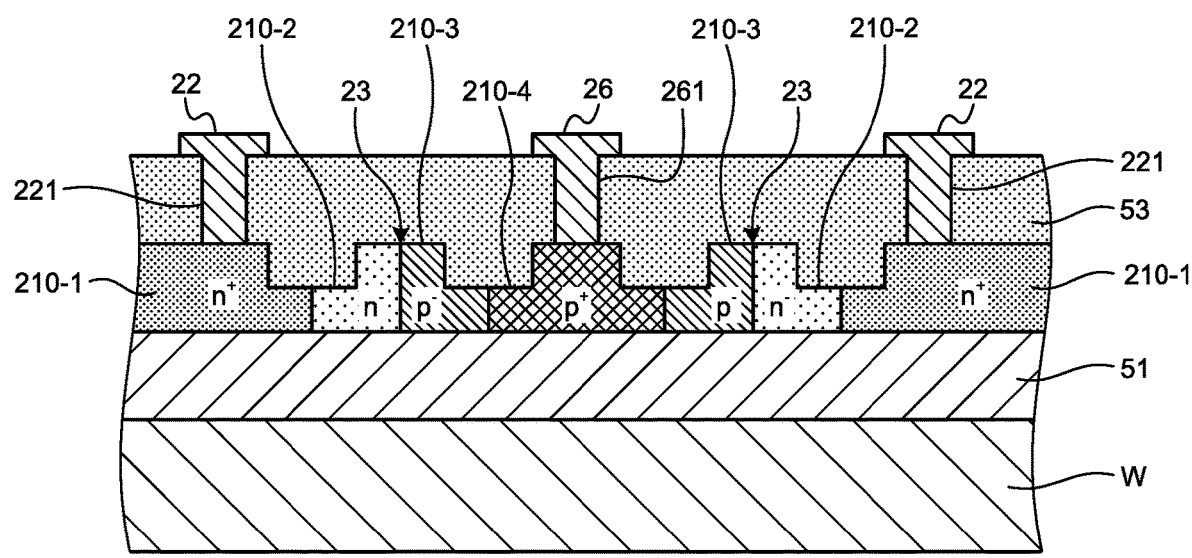
FIG. 4 is a diagram illustrating an A-A sectional view illustrating the example of the configuration of the modulator.

FIG. 3 is a diagram illustrating an example of a configuration of the modulators 21. FIG. 4 is an A-A sectional view illustrating the example of the configuration of the modulators 21. An A-A cross section in FIG. 3 corresponds to FIG. 4. The modulators 21 each include signal wirings 22, a ground wiring 26, a semiconductor layer 210-1, a semiconductor layer 210-2, a semiconductor layer 210-3, and a semiconductor layer 210-4. The signal wirings 22, the ground wiring 26, the semiconductor layer 210-1, the semiconductor layer 210-2, the semiconductor layer 210-3, and the semiconductor layer 210-4 are arranged along the waveguide 23.

For example, as illustrated in FIG. 4, the semiconductor layer 210-1, the semiconductor layer 210-2, the semiconductor layer 210-3, and the semiconductor layer 210-4 are formed on a buried oxide (BOX) layer 51 layered on a substrate W of single crystal silicon. The semiconductor layer 210-1, the semiconductor layer 210-2, the semiconductor layer 210-3, and the semiconductor layer 210-4 have an insulating layer 53 of a silicon oxide layered thereon and the signal wirings 22 and the ground wiring 26 are formed on the insulating layer 53. The substrate W is an example of a silicon substrate.

The semiconductor layer 210-1 is silicon added with an n-type impurity, for example, phosphorus, in a high concentration. The semiconductor layer 210-2 is silicon added with an n-type impurity, for example, phosphorus, in a concentration lower than that in the semiconductor layer 210-1. The semiconductor layer 210-3 is silicon added with a p-type impurity, for example, boron, in a low concentration. The semiconductor layer 210-4 is silicon added with a p-type impurity, for example, boron, in a concentration higher than that in the semiconductor layer 210-3.

A joint between the semiconductor layer 210-2 and semiconductor layer 210-3 functions as the waveguide 23. The semiconductor layer 210-1 has the signal wiring 22 connected thereto via a contact 221 formed of a material including a metal. The semiconductor layer 210-4 has the ground wiring 26 connected thereto via a contact 261 formed of a material including a metal.

Substrate W Having Plural Optical Transmission Devices 20 Formed Thereon

Figure 5:
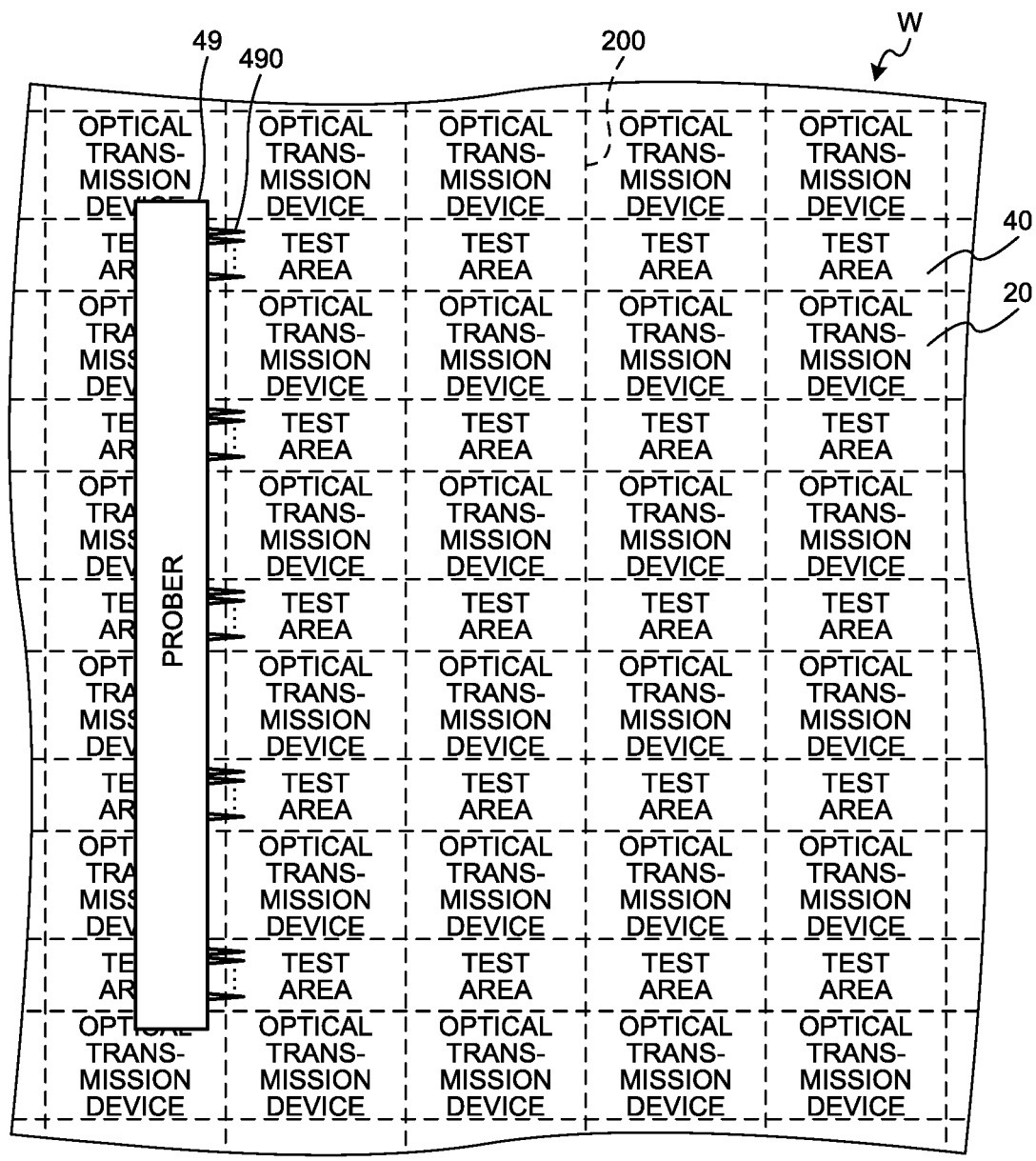
FIG. 5 is a diagram illustrating an example of a substrate having plural optical transmission devices formed thereon.

FIG. 5 is a diagram illustrating an example of the substrate W having a plurality of the optical transmission devices 20 formed thereon. The plural optical transmission devices 20 are formed on the single substrate W, as illustrated in FIG. 5, for example. An area on the substrate W is an example of a device area, the area being where each of the optical transmission devices 20 is formed. Plural test areas 40 are formed, in addition to the optical transmission devices 20, on the substrate W. The signal wirings 22 and the ground wirings 26 of each of the optical transmission devices 20 are connected to pads provided in one of the test areas 40 that is adjacent to that optical transmission device 20 on the substrate W, via the silicon wirings 27.

A prober 49 brings probe needles 490 into contact with the pads in the test area 40, supplies a test signal to the optical transmission device 20 via the test area 40, and acquires an output signal output from the optical transmission device 20 via the test area 40. Based on output signals from the optical transmission devices 20, the prober 49 evaluates electrical properties of the optical transmission devices 20. For example, by determining whether or not a voltage value or a current value of the output signal from the optical transmission device 20 is a value in a predetermined range, the prober 49 evaluates an electrical property of the optical transmission device 20. The prober 49 then outputs a result of the evaluation to a display not illustrated in the drawings.

According to this embodiment, the prober 49 supplies test signals to the pads provided in the plural test areas 40 and acquires output signals output in response to the test signals supplied. The prober 49 is thereby able to collectively evaluate the electrical properties of the plural optical transmission devices 20.

When the evaluation of the optical transmission devices 20 by the prober 49 is finished, the substrate W is separated into the individual optical transmission devices 20 by being diced along dicing lines 200. According to this embodiment, the substrate W is diced by use of laser light, for example. Accordingly, if metal wirings that do not transmit laser light intersect the dicing lines 200, the substrate W is difficult to be diced by use of laser light. Therefore, according to this embodiment, the silicon wirings 27 that transmit laser light are used as wirings that intersect the dicing lines 200.

Details of Test Areas 40

Figure 6:
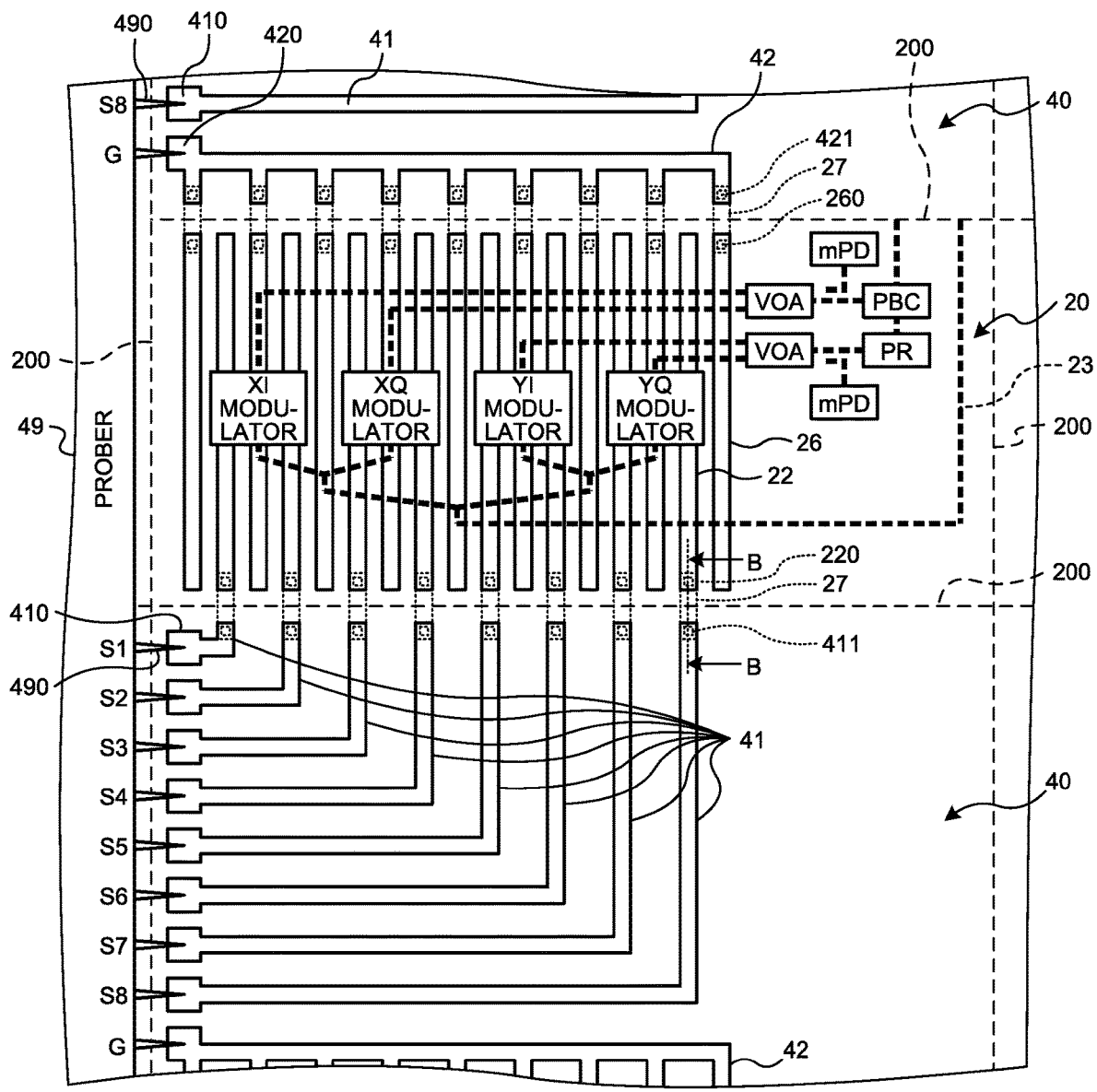
FIG. 6 is a diagram illustrating an example of a configuration of a test area.

FIG. 6 is a diagram illustrating an example of a configuration of the test areas 40. A test area 40 is provided with plural signal wirings 41 and a ground wiring 42, as illustrated in FIG. 6, for example. The signal wirings 41 and the ground wiring 42 are formed of a material including a metal, on a surface of the test area 40.

Figure 7:
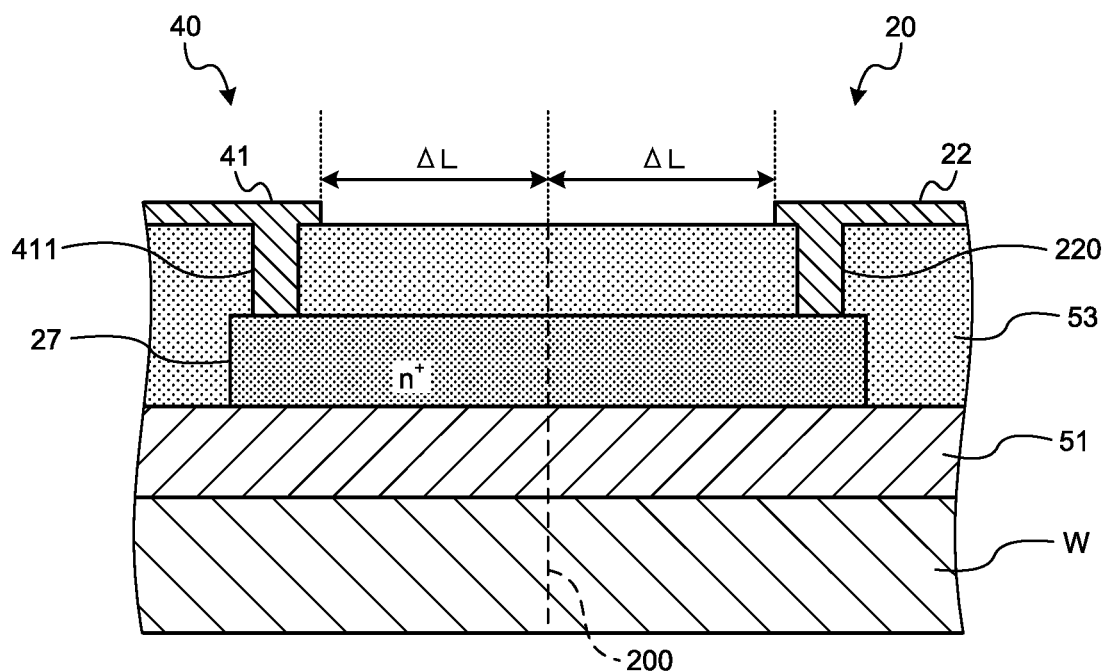
FIG. 7 is a diagram illustrating an example of a B-B cross section of the substrate near a dicing line.

FIG. 7 is a diagram illustrating an example of a B-B cross section of the substrate W near a dicing line. The silicon wiring 27 connected to the signal wiring 22 via the via 220 intersects the dicing line 200 and extends to an area in the test area 40, as illustrated in FIG. 7, for example. One end of the signal wiring 41 provided in the test area 40 is connected, via a via 411, to the silicon wiring 27 connected to the signal wiring 22, as illustrated in FIG. 7, for example. The signal wiring 22 is located in the area of the optical transmission device 20, the area being away from the dicing line 200 by the predetermined distance $\Delta L$ or more, and the signal wiring 41 is located in the test area 40 that is away from the dicing line 200 by the predetermined distance $\Delta L$ or more.

Description will be continued by reference to FIG. 6 again. A pad 410 formed of a material including a metal is provided at the other end of the signal wiring 41. By bringing a probe needle 490 (S1 to S8) into contact with the pad 410, the prober 49 supplies a test signal to the optical transmission device 20 via the signal wiring 41. The pad 410 is an example of a first pad, and the probe needle 490 that contacts the pad 410 is an example of a first probe needle.

Furthermore, the silicon wiring 27 connected to the ground wiring 26 via the via 260 intersects the dicing line 200 and extends to the area in the test area 40, similarly to FIG. 7, for example. An end of the ground wiring 42 provided in the test area 40 is connected, via a via 421, to the silicon wiring 27 connected to the ground wiring 26, similarly to FIG. 7, for example. The ground wiring 26 is located in the area of the optical transmission device 20, the area being away from the dicing line 200 by the predetermined distance $\Delta L$ or more, and the ground wiring 42 is located in the test area 40 that is away from the dicing line 200 by the predetermined distance $\Delta L$ or more.

Furthermore, a pad 420 formed of a material including a metal is provided at another end of the ground wiring 42. By bringing a probe needle 490 (G) into contact with the pad 420, the prober 49 acquires an output signal output from the optical transmission device 20 via the ground wiring 42. The pad 420 is an example of a second pad, and the probe needle 490 that contacts the pad 420 is an example of a second probe needle.

Manufacturing Procedure for Optical Transmission Device 20

Described next while reference is made to FIG. 8 to FIG. 16 is a manufacturing procedure for the optical transmission device 20. FIG. 8 to FIG. 16 are diagrams illustrating an example of a manufacturing process for the optical transmission device 20. FIG. 8 to FIG. 16 illustrate an example of a manufacturing process for the modulators 21 in the optical transmission device 20.

Figure 8:
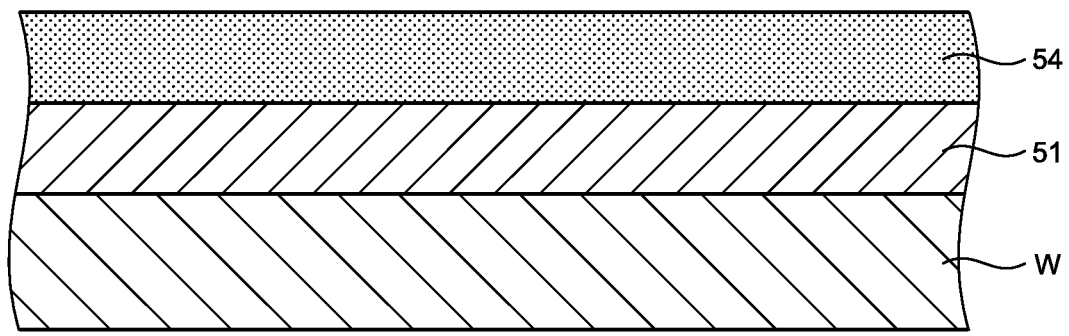
FIG. 8 is a diagram illustrating an example of an optical transmission device manufacturing process.
Figure 9:
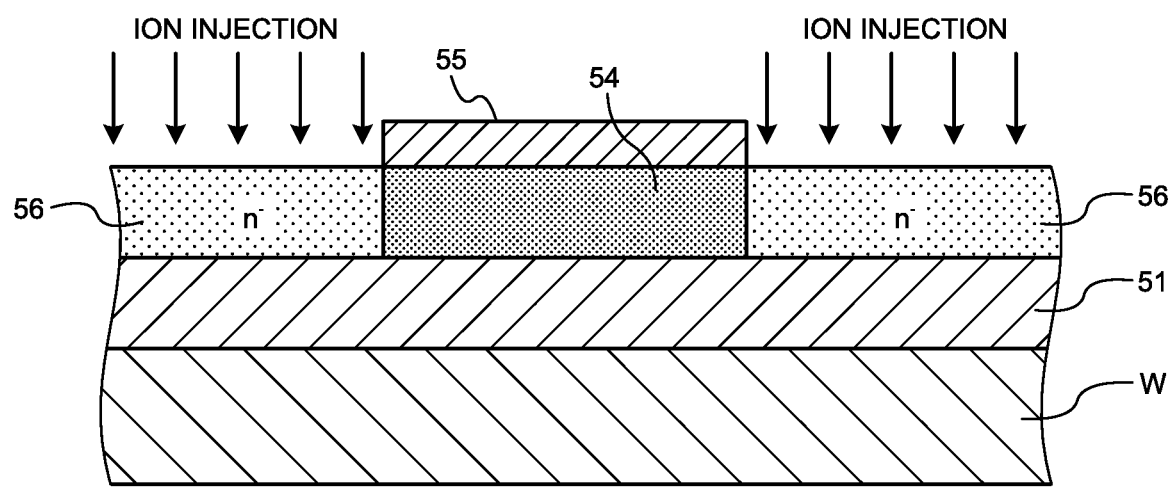
FIG. 9 is a diagram illustrating the example of the optical transmission device manufacturing process.

Firstly, as illustrated in FIG. 8, for example, the BOX layer 51 is layered on the substrate W and a silicon layer 54 is layered on the BOX layer 51. A resist 55 is layered on the silicon layer 54 and the resist 55 is patterned such that areas where the semiconductor layer 210-1 and the semiconductor layer 210-2 are to be arranged are exposed. As illustrated in FIG. 9, for example, ions of an n-type impurity, for example, phosphorus ions, are injected into regions of the silicon layer 54, the regions being not covered by the resist 55. A semiconductor layer 56 added with the n-type impurity in a low concentration is thereby formed. The resist 55 is then removed. The n-type impurity is an example of a first impurity.

In the step exemplified by FIG. 9, the resist 55 is patterned such that areas where the silicon wirings 27 are to be formed are also exposed. Ions of an n-type impurity are thereby injected also into regions of the silicon layer 54, the regions being where the silicon wirings 27 are to be formed.

Figure 10:
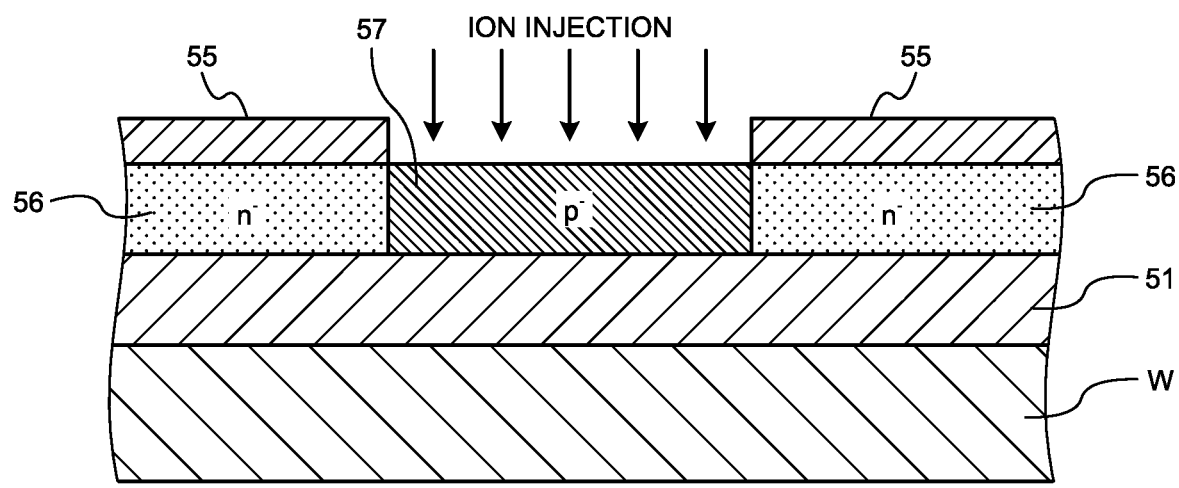
FIG. 10 is a diagram illustrating the example of the optical transmission device manufacturing process.

Subsequently, a resist 55 is layered on the silicon layer 54 again and the resist 55 is patterned such that areas where the semiconductor layer 210-3 and the semiconductor layer 210-4 are to be arranged are exposed. As illustrated in FIG. 10, for example, ions of a p-type impurity, for example, boron ions, are injected into regions of the silicon layer 54, the regions being not covered by the resist 55. A semiconductor layer 57 added with the p-type impurity in a low concentration is thereby formed. The resist 55 is then removed. The p-type impurity is an example of a second impurity.

Figure 11:
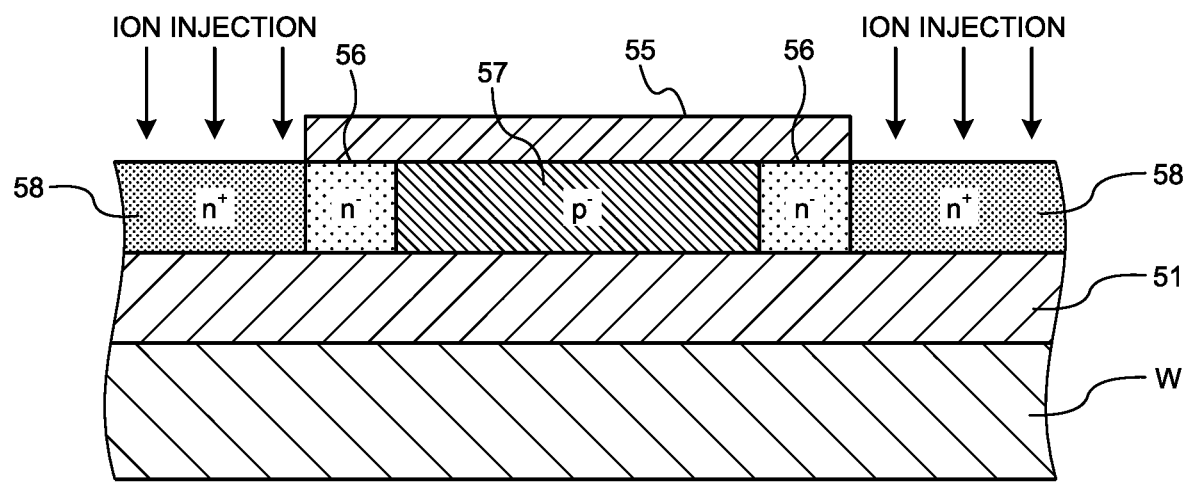
FIG. 11 is a diagram illustrating the example of the optical transmission device manufacturing process.

Subsequently, a resist 55 is layered on the silicon layer 54 again and the resist 55 is patterned such that areas where the semiconductor layer 210-1 is to be located are exposed. As illustrated in FIG. 11, for example, ions of an n-type impurity, for example, phosphorus ions, are then further injected into regions of the semiconductor layer 56, the regions being not covered by the resist 55. A semiconductor layer 58 added with the n-type impurity in a concentration higher than that in the semiconductor layer 56 is formed on the areas where the semiconductor layer 210-1 is to be located. The resist 55 is then removed.

In the step illustrated in FIG. 11, the resist 55 is patterned such that areas where the silicon wirings 27 are to be formed are also exposed. Ions of an n-type impurity are thereby further injected into regions where the silicon wirings 27 are to be formed. The silicon wirings 27 added with the n-type impurity in a high concentration are thereby formed in the regions of the silicon layer 54, the regions being where the silicon wirings 27 are formed. As described above, because the silicon wirings 27 are able to be formed in the manufacturing process for the optical transmission device 20, the silicon wirings 27 are able to be formed efficiently on the substrate W.

Figure 12:
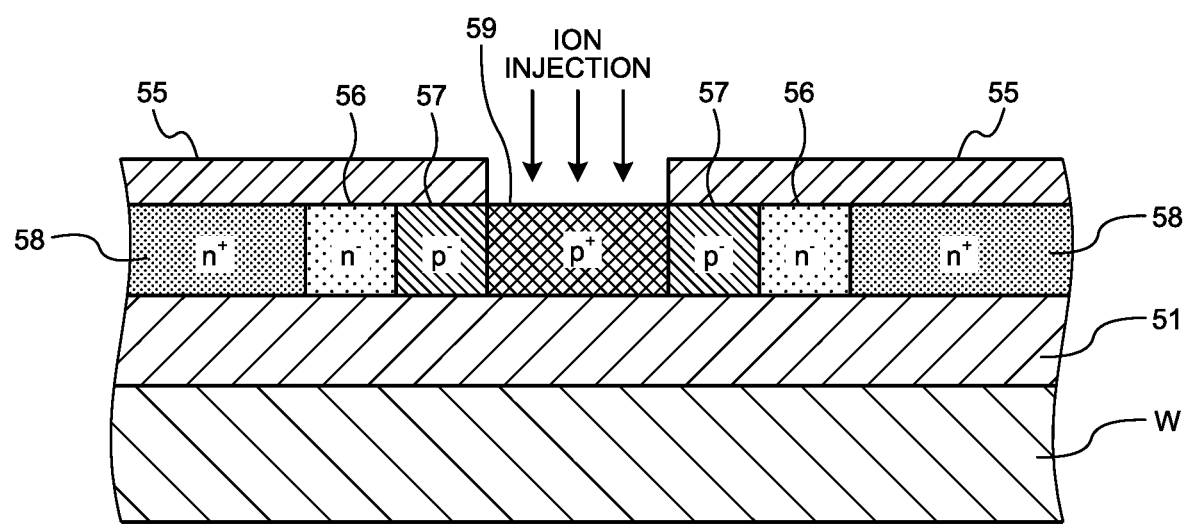
FIG. 12 is a diagram illustrating the example of the optical transmission device manufacturing process.

Subsequently, a resist 55 is layered on the silicon layer 54 again and the resist 55 is patterned such that areas where the semiconductor layer 210-4 is to be located are exposed. As illustrated in FIG. 12, for example, ions of a p-type impurity, for example, boron ions, are then further injected into regions of the semiconductor layer 57, the regions being not covered by the resist 55. A semiconductor layer 59 added with the p-type impurity in a concentration higher than that in the semiconductor layer 210-3 is thereby formed in the regions where the semiconductor layer 210-4 is to be located. The resist 55 is then removed.

Figure 13:
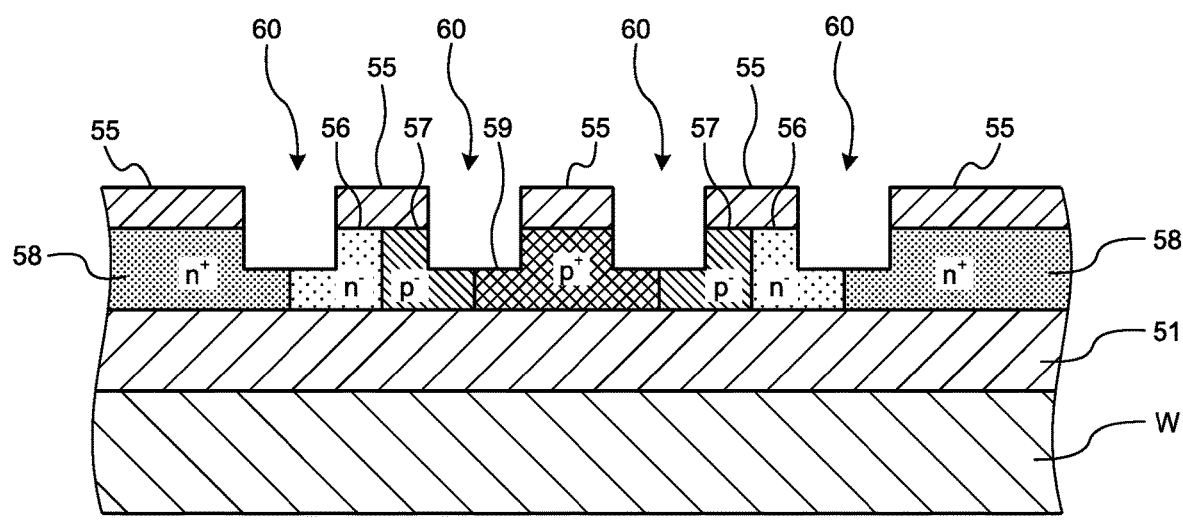
FIG. 13 is a diagram illustrating the example of the optical transmission device manufacturing process.

Subsequently, a resist 55 is layered on the silicon layer 54 again and the resist 55 is patterned such that peripheries of the PN junctions that serve as the waveguide 23 are exposed. Through etching of regions not covered by the resist 55, as illustrated in FIG. 13, for example, recessed portions 60 are formed along the PN joints. The resist 55 is then removed.

Figure 14:
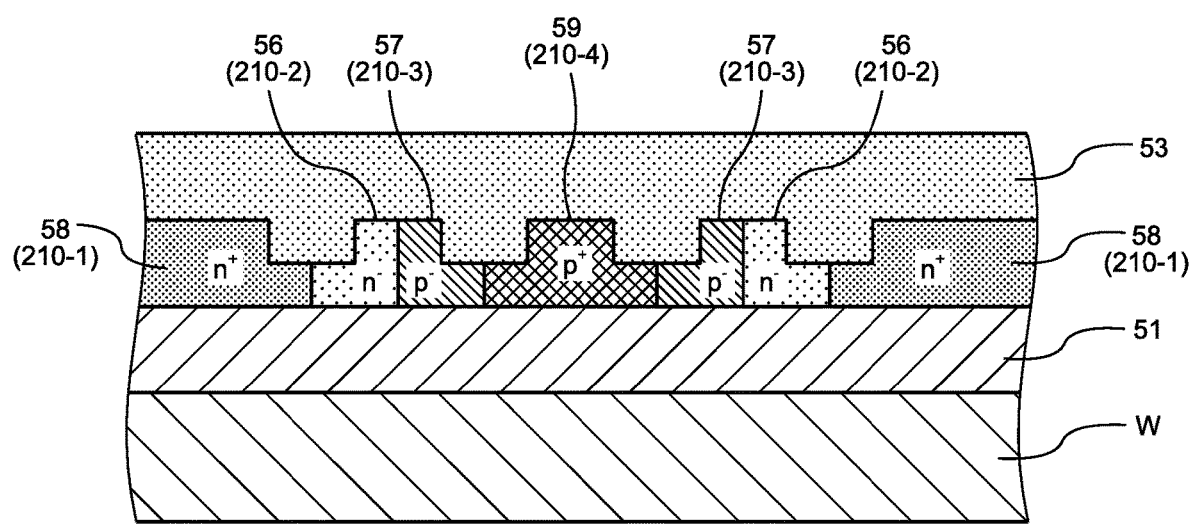
FIG. 14 is a diagram illustrating the example of the optical transmission device manufacturing process.

Subsequently, as illustrated in FIG. 14, for example, the insulating layer 53 is layered to cover the semiconductor layer 56, the semiconductor layer 57, the semiconductor layer 58, and the semiconductor layer 59. The semiconductor layer 56 corresponds to the semiconductor layer 210-2, the semiconductor layer 57 corresponds to the semiconductor layer 210-3, the semiconductor layer 58 corresponds to the semiconductor layer 210-1, and the semiconductor layer 59 corresponds to the semiconductor layer 210-4.

Figure 15:
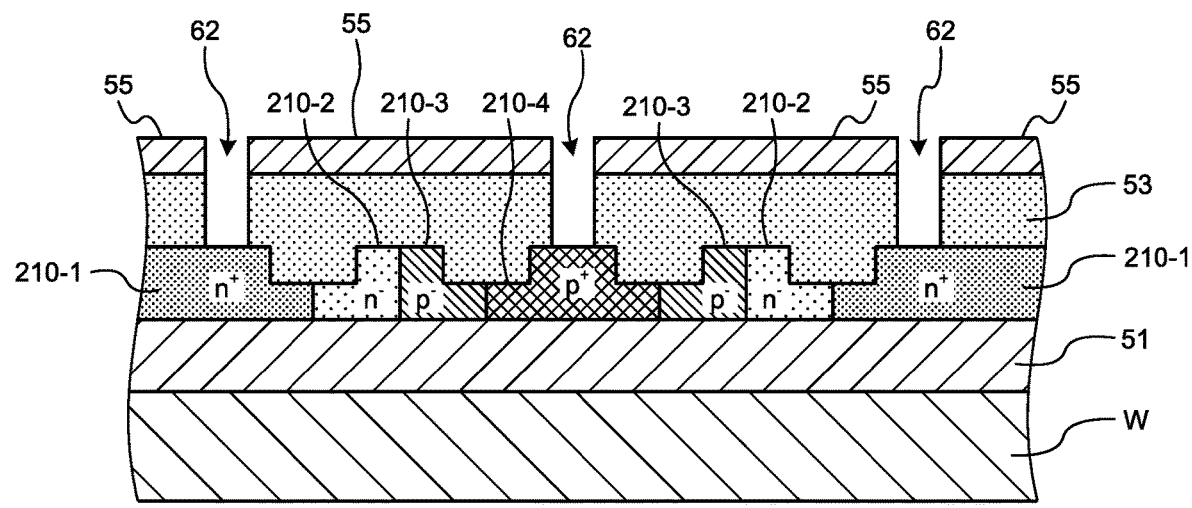
FIG. 15 is a diagram illustrating the example of the optical transmission device manufacturing process.

Subsequently, a resist 55 is layered on the insulating layer 53, and the resist 55 is patterned such that areas where the contacts 221 and the contacts 261 are to be formed are exposed. Through etching of the regions not covered by the resist 55, as illustrated in FIG. 15, for example, recessed portions 62 are formed in the insulating layer 53. The resist 55 is then removed.

At that time, the resist 55 is patterned such that regions where the vias 220, the vias 260, the vias 411, and the vias 421 are to be formed are exposed, and the regions not covered with the resist 55 are etched. Recessed portions 62 are also formed at positions of the insulating layer 53, the positions being where the vias 220, the vias 260, the vias 411, and the vias 421 are to be formed.

Figure 16:
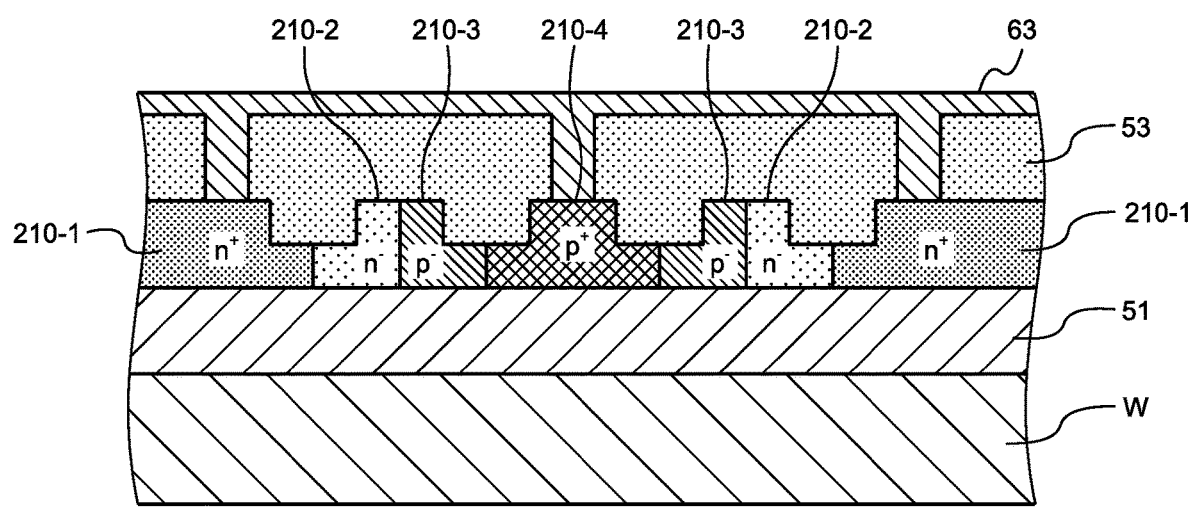
FIG. 16 is a diagram illustrating the example of the optical transmission device manufacturing process.

Subsequently, as illustrated in FIG. 16, for example, a wiring material 63 including a metal is layered in the recessed portions 62 and the wiring material 63 is further layered on the insulating layer 53. Through patterning of the wiring material 63, the optical transmission device 20 exemplified by FIG. 4 is formed.

At that time, the wiring material 63 including the metal is also layered in the recessed portions 62 formed at the positions of the vias 220, the vias 260, the vias 411, and the vias 421 and the wiring material 63 is further layered on the insulating layer 53. Through patterning of the wiring material 63, the signal wirings 41 and the ground wirings 42 exemplified by FIG. 6 are formed.

Test Method

Figure 17:
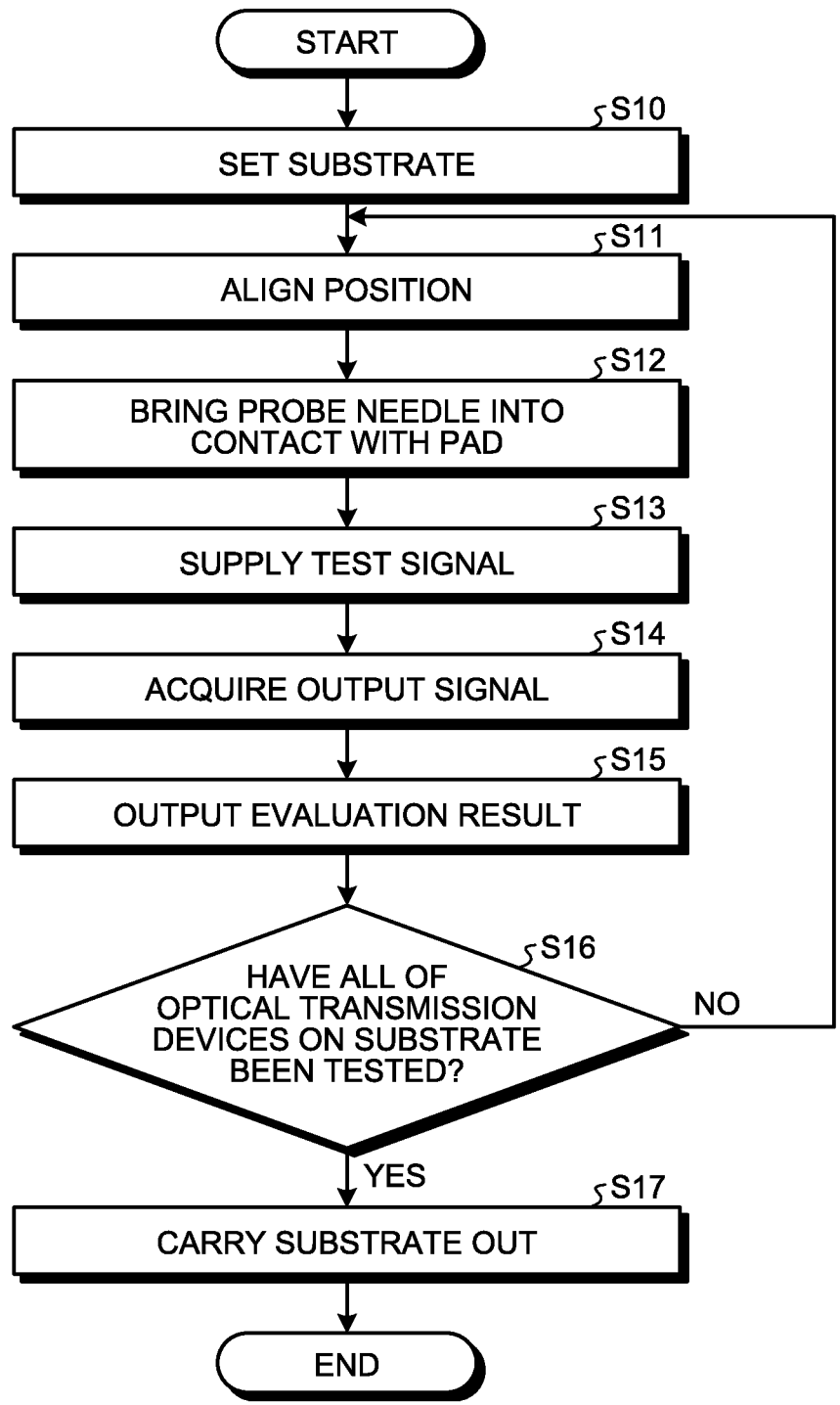
FIG. 17 is a flow chart illustrating an example of an optical transmission device test method.

FIG. 17 is a flow chart illustrating an example of a test method for the optical transmission devices 20.

Firstly, the substrate W having the plural optical transmission devices 20 formed thereon is set in a holder not illustrated in the drawings and is held by the holder (S10). By at least one of the prober 49 and the substrate W moving, the prober 49 moves relatively to the substrate W and aligns a position of a distal end of a probe needle 490 with a position of a pad 410 or a pad 420 in the test area 40 (S11). The prober 49 then brings distal ends of probe needles 490 closer to the pads 410 and the pads 420 and brings the distal ends of the probe needles 490 into contact with the pads 410 and the pads 420 (S12).

Subsequently, the prober 49 supplies test signals to the optical transmission devices 20 from the probe needles 490 that are in contact with the pads 410 of the signal wirings 41 (S13). The prober 49 then acquires output signals of the optical transmission devices 20 from the probe needles 490 that are in contact with the pads 420 of the ground wirings 42 (S14). Based on the output signals acquired, the prober 49 evaluates electrical properties of the optical transmission devices 20. For example, by determining whether or not a voltage value or a current value of the output signal from the optical transmission device 20 is a value in a predetermined range, the prober 49 evaluates the electrical property of the optical transmission device 20. The prober 49 then outputs a result of the evaluation to a display not illustrated in the drawings (S15).

Subsequently, the prober 49 determines whether or not all of the optical transmission devices 20 on the substrate W have been tested (S16). If there is an optical transmission device 20 that has not been tested on the substrate W (S16: No), the prober 49 executes the processing at Step S11 again. On the contrary, if all of the optical transmission devices 20 on the substrate W have been tested (S16: Yes), the substrate W is carried out from the holder (S17). The test method exemplified by FIG. 17 is then ended.

Effects of Embodiment

As disclosed by the above description, the optical transmission device 20 according to the embodiment includes the substrate W, the waveguide 23, the signal wirings 22, and the silicon wirings 27. The waveguide 23 is provided on the substrate W and transmits an optical signal. The signal wirings 22 are provided on the substrate W and transmit electric signals. The silicon wirings 27 are provided in the substrate W and are silicon added with an impurity. The signal wirings 22 are arranged in an area of the substrate W, the area being away from an end of the substrate W by a predetermined distance or more. One end of the silicon wirings 27 is connected to the signal wirings 22, and the other end of the silicon wirings 27 extends to the end of the substrate W. As a result, dicing is able to be performed after electrical properties have been checked on the substrate W. Therefore, electrical properties of the plural optical transmission devices 20 formed on the substrate W are able to be checked collectively.

Furthermore, the above described optical transmission device 20 according to the embodiment includes the modulators 21 that modulate an optical signal transmitted through the waveguide 23 according to electric signals, and the signal wirings 22 supply the electric signals to the modulators 21. As a result, dicing is able to be performed after electrical properties of the modulators 21 have been checked on the substrate W.

Furthermore, according to the embodiment described above, the silicon wirings 27 are added with an n-type impurity. As a result, the resistance value of the silicon wirings 27 is able to be made smaller. According to the embodiment described above, a p-type impurity may be added to the silicon wirings 27 instead of the n-type impurity.

Furthermore, according to the embodiment described above, the semiconductor layer 210-1 that is silicon added with an n-type impurity is provided along the waveguide 23, and the semiconductor layer 210-4 that is silicon added with a p-type impurity is provided along the waveguide 23. As a result, the silicon wirings 27 are able to be formed in the manufacturing process for the modulators 21 and the silicon wirings 27 are thus able to be formed efficiently on the substrate W.

Furthermore, according to the embodiment described above, the optical transmission and reception device 10 includes: the optical transmission device 20 that transmits an optical signal modulated according to an electric signal; and the optical reception device 30 that receives an optical signal and outputs an electric signal according to the optical signal received. As a result, the optical transmission and reception device 10 high in productivity is able to be provided.

Furthermore, in the above described test method according to the embodiment, the substrate W is held, the substrate W having, formed therein, the optical transmission devices 20 and the test areas 40 with the dicing lines 200 interposed therebetween. The probe needles 490 come into contact with the pads 410 provided in the test areas 40 and the probe needles 490 come into contact with the pads 420 provided in the test areas 40. Test signals are supplied via the probe needles 490 that are in contact with the pads 410, and based on output signals output via the probe needles 490 that are in contact with the pads 420, electrical properties of the optical transmission devices 20 are evaluated. As a result, dicing is able to be performed after the electrical properties have been checked on the substrate W. Therefore, the electrical properties of the plural optical transmission devices 20 formed on the substrate W are able to be checked collectively.

Furthermore, in the above described manufacturing method according to the embodiment, an impurity is injected into a part of a device area where the optical transmission device 20 is formed, on the substrate W of single crystal silicon. In addition, by injection of an impurity into an area where the dicing line 200 defining the device area passes through, the silicon wirings 27 that intersect the dicing line 200 are formed between the device area and the test area 40 adjacent to the device area with the dicing line 200 interposed between the device area and the test area 40. What is more, the insulating layer 53 is layered on the substrate W, and the signal wirings 22 connected to the silicon wirings 27 and the part injected with the impurity are formed on the insulating layer 53, at positions away from a dicing line 300 in the device area by a predetermined distance or more. Furthermore, the pads 410 connected to the silicon wirings 27 are formed on the insulating layer 53 at positions away from the dicing line 200 in the test area 40 by a predetermined distance or more.

Other Modifications

The disclosed techniques are not limited to the embodiment described above, and various modifications are possible within the scope of the gist of the disclosed techniques.

For example, according to the embodiment described above, the silicon wirings 27 are connected to the signal wirings 22 via the vias 220 on an input terminal side of the modulators 21 and the silicon wirings 27 remain at the signal wirings 22 on the input terminal side of the modulators 21 even after dicing. When the silicon wirings 27 remain at the signal wirings 22 on the input terminal side of the modulators 21, transmission signals are attenuated at some frequencies due to reflection of the transmission signals by the silicon wirings 27 and frequency characteristics of the modulators 21 may be degraded.

Figure 18:
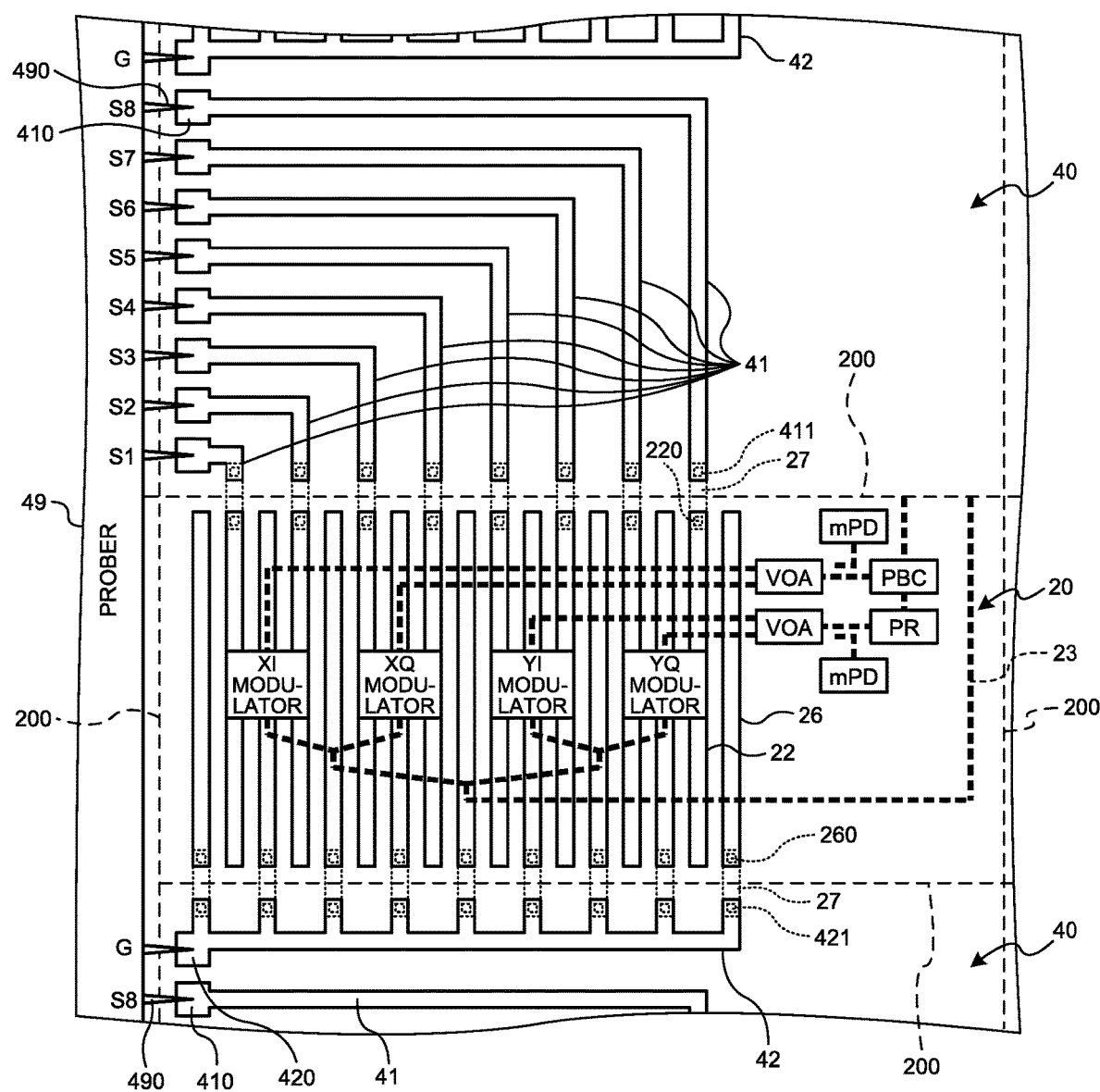
FIG. 18 is a diagram illustrating another example of the configuration of the test area.

Accordingly, as illustrated in FIG. 18, for example, silicon wirings 27 may be connected to signal wirings 22 on an end terminal side of the modulators 21 via vias 220. FIG. 18 is a diagram illustrating another example of the configuration of the test areas 40. Transmission signals supplied to the modulators 21 are input from input terminals of the signal wirings 22 arranged along the waveguide 23 but silicon wirings 27 are connected to end terminals of the signal wirings 22. As a result, even if the transmission signals supplied from the signal wirings 22 on the input terminal side of the modulators 21 are reflected by the silicon wirings 27 connected to the signal wirings 22 on the end terminal side of the modulators 21, the reflected waves are able to be attenuated sufficiently before the reflected waves reach the modulators 21. Degradation of frequency characteristics of the modulators 21 is thereby able to be reduced.

Furthermore, in the test areas 40 exemplified by FIG. 18, silicon wirings 27 are connected to the ground wirings 26 on the input terminal side of the modulators 21 via vias 260, and the silicon wirings 27 remain at the ground wirings 26 on the input terminal side of the modulators 21 even after dicing. When the silicon wirings 27 remain on the input terminal side of the ground wirings 26 of the modulators 21, the frequency characteristics of the modulators 21 may be degraded.

Figure 19:
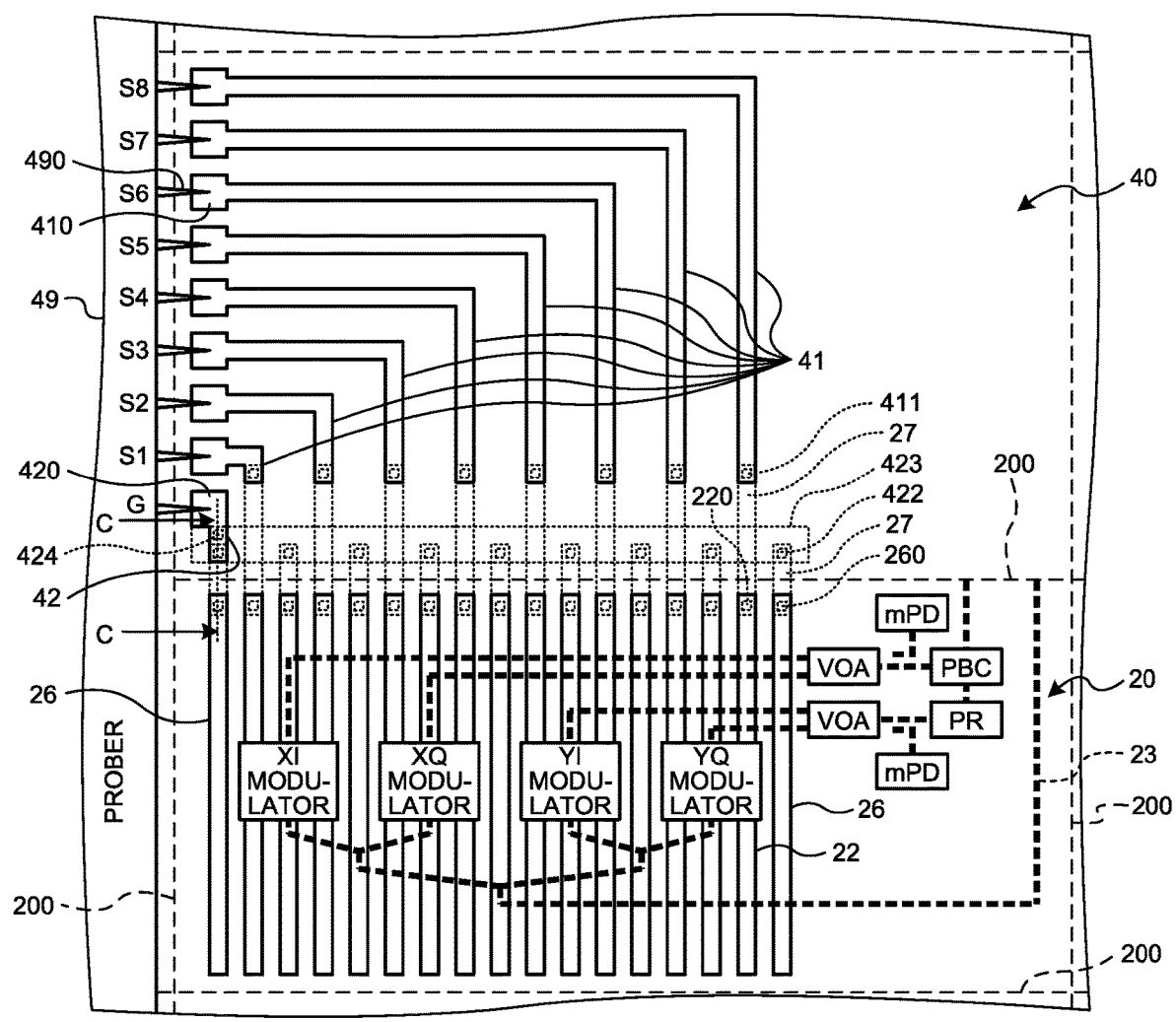
FIG. 19 is a diagram illustrating still another example of the configuration of the test area.
Figure 20:
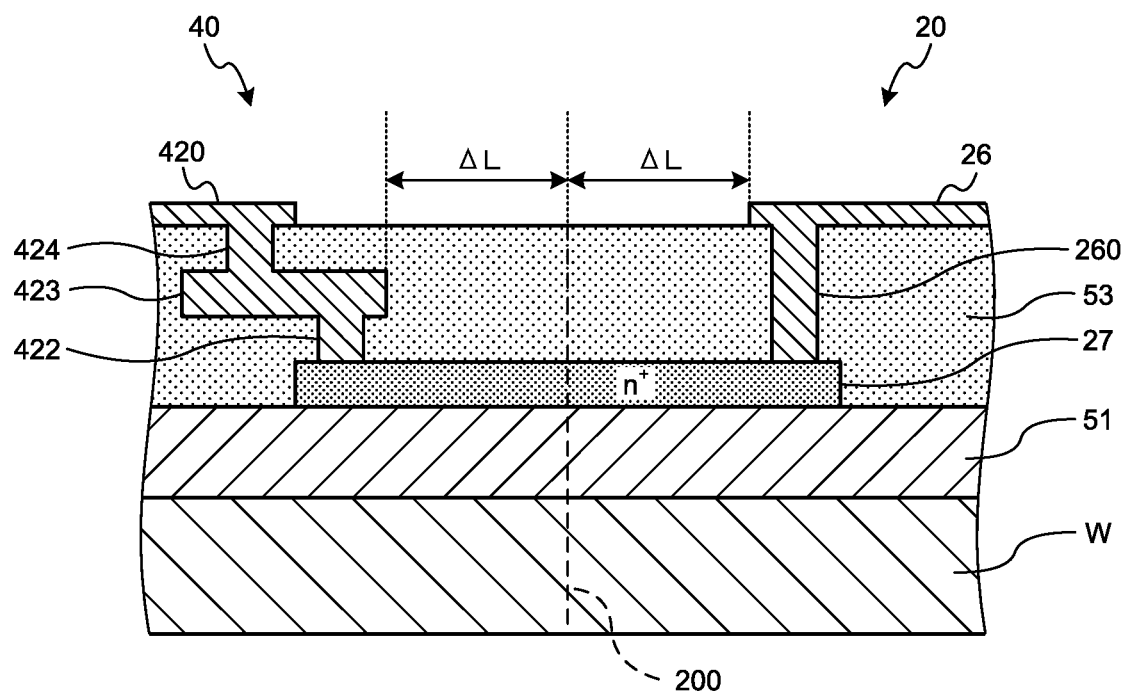
FIG. 20 is a diagram illustrating an example of a C-C cross section of a substrate near a dicing line.

Therefore, as illustrated in FIG. 19, for example, silicon wirings 27 may be provided on the end terminal side of the modulators 21. FIG. 19 is a diagram illustrating still another example of the configuration of the test areas 40. FIG. 20 is a diagram illustrating an example of a C-C cross section of a substrate W near a dicing line 200. Transmission signals supplied to the modulators 21 are input from the input terminals of the signal wirings 22. Silicon wirings 27 connected to signal wirings 41 of a test area 40 are connected to end terminals of the signal wirings 22, and silicon wirings 27 connected to a ground wiring 42 of the test area 40 are connected to ends of the ground wirings 26 corresponding to the end terminals of the signal wirings 22.

The plural silicon wirings 27 connected to the ground wirings 26 via vias 260 are respectively connected to an intermediate wiring 423 via vias 422, as illustrated in FIG. 20, for example. The intermediate wiring 423 is formed of the same material as the signal wirings 41 and ground wiring 42. The intermediate wiring 423 may be formed of the same material as the silicon wirings 27. The intermediate wiring 423 is connected to a pad 420 via a via 424. As a result, degradation of frequency characteristics of the modulators 21 is able to reduced.

Figure 21:
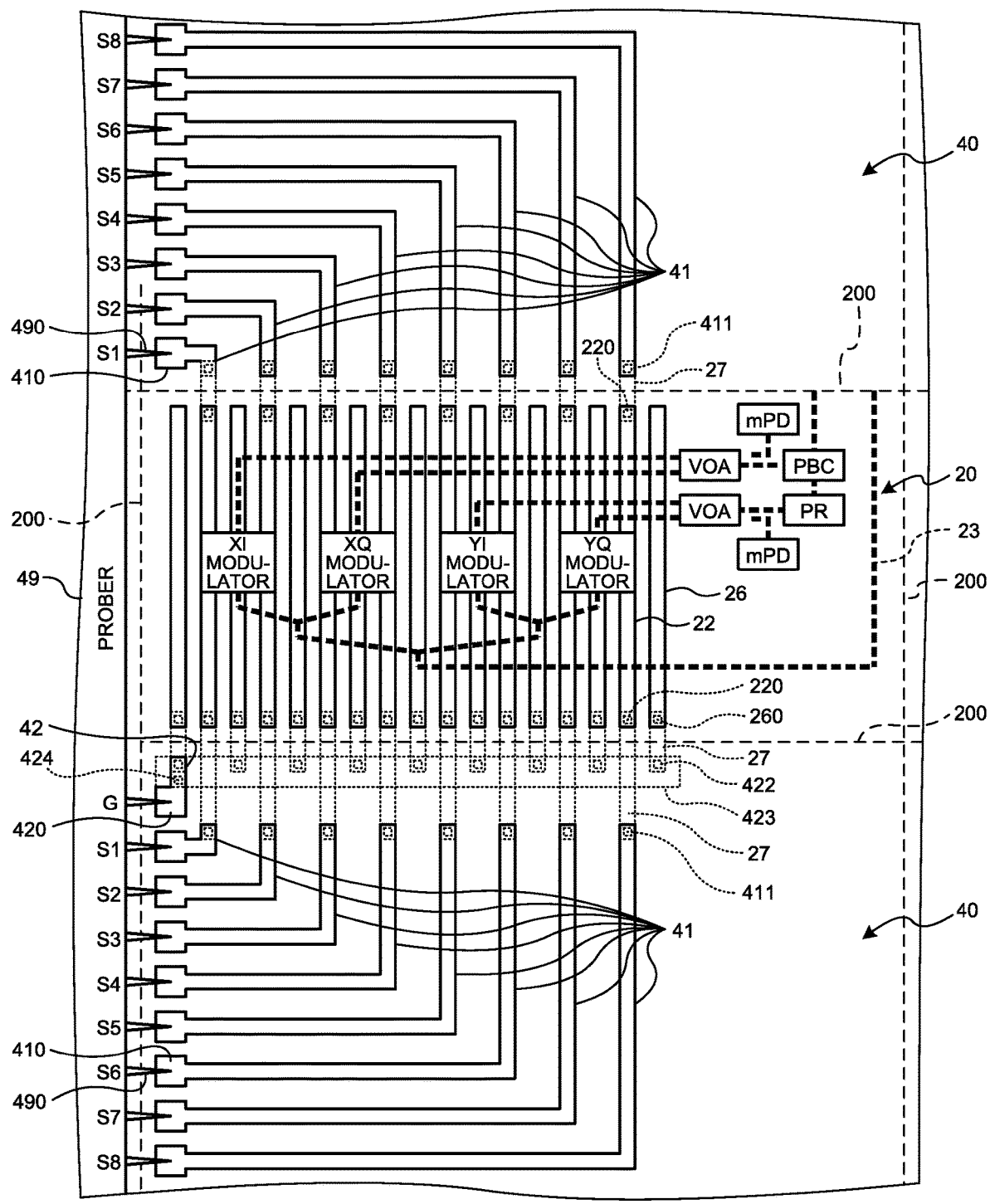
FIG. 21 is a diagram illustrating yet another example of the configuration of the test area.

Furthermore, according to the above described embodiment, test signals are input from one end of the signal wirings 22 and electrical properties of the optical transmission device 20 are evaluated based on output signals output from the ground wirings 26, but the disclosed techniques are not limited to this embodiment. For example, as illustrated in FIG. 21, a test signal may be input from one end of each of the signal wirings 22, and a continuity test of that signal wiring 22 may be performed based on a signal output from the other end of the signal wiring 22. FIG. 21 is a diagram illustrating yet another example of the configuration of the test areas 40. As a result, a continuity test of each of the signal wirings 22 formed in the optical transmission device 20 is able to be performed. The silicon wirings 27 connected respectively to the input terminals of the signal wirings 22 are each an example of a third silicon wiring, and the silicon wirings 27 connected respectively to the end terminals of the signal wirings 22 are each an example of a fourth silicon wiring.

Figure 22:
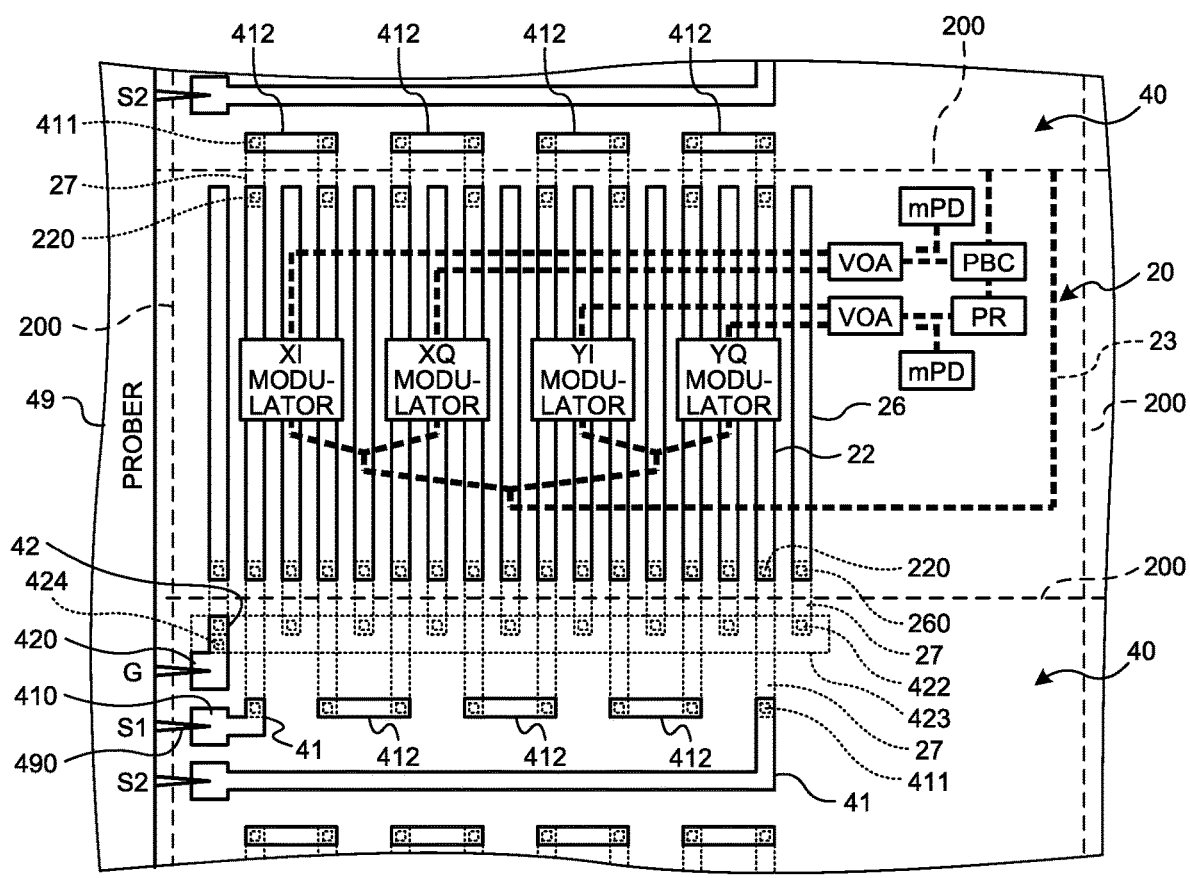
FIG. 22 is a diagram illustrating still another example of the configuration of the test area.

Furthermore, as illustrated in FIG. 22, for example, adjacent ones of the signal wirings 22 may be connected to each other in a daisy chain form via a wiring 412 on a test area 40. FIG. 22 is a diagram illustrating still another example of the configuration of the test areas 40. As a result, the test areas 40 are able to be made smaller in area and more optical transmission devices 20 are able to be formed on a single substrate W.

Furthermore, the embodiment described above relates to an example with optical modulators where PN junctions of a silicon waveguide are utilized, but the disclosed techniques are not limited to this example. For example, the disclosed techniques may be applied to optical modulators having a ferroelectric material or a polymer used therein. Involved in an optical modulator having a ferroelectric material or a polymer used therein is a process of poling through application of voltage to the material. The above described arrangement of the signal wirings 22, ground wirings 26, and silicon wirings 27 according to the embodiment may also be used in a poling process, and not only in testing of optical modulators.

According to an embodiment, electrical properties of plural optical devices formed on a substrate are able to be checked collectively.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An optical device, comprising:
    a substrate;
    a waveguide that is provided in the substrate and transmits an optical signal;
    a metal wiring that is provided in the substrate and transmits an electric signal; and
    a silicon wiring that is provided in the substrate and is silicon added with an impurity, wherein
    the metal wiring is placed in an area of the substrate, the area being away from an end of the substrate by a predetermined distance or more,
    one end of the silicon wiring is connected to the metal wiring, and
    the other end of the silicon wiring extends to the end of the substrate.

2. The optical device according to claim 1, further comprising:
    a modulator that modulates, according to the electric signal, the optical signal transmitted through the waveguide, wherein
    the metal wiring supplies the electric signal to the modulator.

3. The optical device according to claim 2, wherein the silicon wiring has been added with an n-type impurity.

4. The optical device according to claim 3, wherein the modulator has been provided with a semiconductor layer that is along the waveguide and that is silicon added with an n-type impurity.

5. The optical device according to claim 2, wherein the silicon wiring has been added with a p-type impurity.

6. The optical device according to claim 5, wherein the modulator has been provided with a semiconductor layer that is along the waveguide and that is silicon added with a p-type impurity.

7. The optical device according to claim 2, wherein
    the electric signal supplied to the modulator is input from an input terminal of the metal wiring placed along the waveguide, and
    the silicon wiring is connected to an end terminal of the metal wiring.

8. The optical device according to claim 7, wherein the metal wiring includes:
   a signal wiring that is placed along the waveguide and transmits the electric signal supplied to the modulator; and
   a ground wiring that is placed along the signal wiring and is connected to a ground,
the silicon wiring includes:
   a first silicon wiring connected to the signal wiring; and
   a second silicon wiring connected to the ground wiring,
the electric signal supplied to the modulator is input from an input terminal of the signal wiring,
the first silicon wiring is connected to an end terminal of the signal wiring, and
the second silicon wiring is connected to an end of the ground wiring, the end corresponding to the end terminal of the signal wiring.

9. The optical device according to claim 2, wherein the electric signal supplied to the modulator is input from an input terminal of the metal wiring placed along the waveguide, and
the silicon wiring includes:
   a third silicon wiring connected to the input terminal of the metal wiring; and
   a fourth silicon wiring connected to an end terminal of the metal wiring.

10. An optical transmission and reception device, comprising:
   the optical device according to claim 1 that functions as an optical transmission device that transmits an optical signal modulated according to an electric signal; and
   an optical reception device that receives an optical signal and outputs an electric signal according to the optical signal received.

* * * * *